US007915965B2

(12) United States Patent
Hardy et al.

(10) Patent No.: US 7,915,965 B2
(45) Date of Patent: Mar. 29, 2011

(54) OSCILLATOR HAVING REDUCED SENSITIVITY TO ACCELERATION

(75) Inventors: Nigel David Hardy, Stansted (GB); George Hedley Storm Rokos, Saffron Walden (GB)

(73) Assignee: Rakon UK Limited (GB)

(*) Notice: Subject to any disclaimer, the term of this patent is extended or adjusted under 35 U.S.C. 154(b) by 0 days.

(21) Appl. No.: 12/306,569

(22) PCT Filed: Jun. 29, 2007

(86) PCT No.: PCT/EP2007/056572
§ 371 (c)(1),
(2), (4) Date: Mar. 26, 2009

(87) PCT Pub. No.: WO2008/000819
PCT Pub. Date: Jan. 3, 2008

(65) Prior Publication Data
US 2009/0201096 A1    Aug. 13, 2009

(30) Foreign Application Priority Data
Jun. 29, 2006  (GB) .................................. 0612934.0

(51) Int. Cl.
*H01L 41/00* (2006.01)
*H01L 41/053* (2006.01)
*H01L 41/107* (2006.01)
*H01L 41/113* (2006.01)
*H02N 2/00* (2006.01)
*H02N 2/18* (2006.01)
*H03B 5/30* (2006.01)
*H03B 5/32* (2006.01)

(52) U.S. Cl. ......... 331/65; 331/68; 331/107 A; 331/154; 331/158; 331/162; 310/348

(58) Field of Classification Search .................. 331/65, 331/66, 68, 69, 107 A, 116 R, 116 FE, 116 M, 331/154, 156–159, 162, 175; 310/311; 348–356
See application file for complete search history.

(56) References Cited

U.S. PATENT DOCUMENTS

| 3,290,609 A | 12/1966 | Shreve |
| 4,317,059 A | 2/1982 | Besson |
| 4,344,010 A | 8/1982 | Vig et al. |
| 4,409,711 A | 10/1983 | Ballato et al. |
| 4,410,822 A * | 10/1983 | Filler ............................ 310/311 |
| 4,575,690 A * | 3/1986 | Walls et al. .................... 331/162 |

OTHER PUBLICATIONS

International Search Report for PCT/EP2007/056572, filed Jun. 29, 2007, mailed on Nov. 19, 2007.
United Kingdom Search Report for GB 0612934.0, filed Jun. 29, 2006, mailed on Oct. 11, 2006.

* cited by examiner

Primary Examiner — David Mis
(74) Attorney, Agent, or Firm — BainwoodHuang

(57) ABSTRACT

This invention relates to an oscillator having reduced sensitivity to acceleration. The oscillator includes a plurality of asymmetrically mounted resonator portions each having an active resonance region. The asymmetric mounting of the resonator portions means that each resonator portion has an axis passing through its active resonance region along which the acceleration sensitivity vector is dominant, i.e. the sensitivity to acceleration along the direction defined by one axis is much greater than the sensitivity to acceleration in other directions. The resonators are mounted in an oscillator such that their dominant axes are directed in different directions, e.g. an anti-parallel arrangement, which means that the dominant acceleration sensitivity vectors can cancel each other out.

22 Claims, 12 Drawing Sheets

Z DIRECTION

OSCILLATOR HAVING REDUCED SENSITIVITY TO ACCELERATION

FIELD OF THE INVENTION

The present invention relates to an oscillator having reduced sensitivity to acceleration. In particular, it relates to an oscillator comprising two asymmetrically mounted resonators.

BACKGROUND OF THE INVENTION

Electronic devices often include an oscillator to provide an oscillating signal for use as a clock source. The oscillating signal can be controlled by a resonator which requires some form of excitation signal to sustain oscillations.

The operation of an oscillator, controlled by the resonator, may be affected by age and certain environmental conditions such as temperature and, of particular interest here, acceleration. When an oscillator is subjected to acceleration, the frequency of the oscillating signal it produces may be altered. The change in frequency is proportional to the magnitude of the acceleration and dependent on direction, giving rise to an acceleration sensitivity vector. A time variable acceleration, for example vibration, can cause frequency modulation of the oscillator's frequency. Reducing the sensitivity of such oscillators to alterations of frequency due to acceleration is therefore desirable in order to produce a stable and pure frequency output from an oscillator.

Known techniques for reducing the sensitivity of oscillators to acceleration may involve packaging and/or resonator design and compensation techniques.

Considering first packaging, this typically involves configuring the packaging so as to achieve a symmetrical crystal resonator design. It has been demonstrated to a first approximation that a theoretical zero exists for the acceleration sensitivity when considering a perfectly symmetric bulk acoustic wave (BAW) resonator and mounting structure. However, achieving a symmetric mounting structure which maintains symmetric stress on the resonator can be a difficult task due to manufacturing imperfections. The configuration of the structure also imposes further problems in terms of stress on the resonator. Spring clips may typically be employed to mount the resonator, so as to reduce stress applied from the surrounding enclosure, but performance may be degraded by resonance of the spring clips themselves, which in turn may lead to amplification of any applied acceleration. Such techniques thus involve relatively large, elaborate designs and complex manufacturing methods.

Turning now to compensation techniques, these mainly fall into three categories: i) mechanical, ii) active and iii) passive. The first category of compensation techniques includes mechanical vibration isolation or dampening techniques. These tend to only affect the upper portion of the vibration frequencies associated with standard conditions, i.e. the upper portion of the ~0 to 3 kHz frequency range. Compensating in this manner in the lower portion of the ~0 to 3 kHz frequency range becomes increasingly difficult due to the necessary increase in size of the mechanical isolation system required to filter out the larger amplitudes. Moreover, the vibration isolation system is itself a resonant structure, which can amplify the vibration at and below its resonant frequency and is often only effective along one direction.

The second category of compensation techniques involves passive devices where multiple resonators are located to form a composite oscillator in such a way as to cancel out the effects of acceleration. This is demonstrated for example in U.S. Pat. No. 4,410,822 and also in U.S. Pat. No. 4,575,690 where individual crystal resonators are manufactured and then analysed in order to ascertain their acceleration sensitivity vectors. Once their acceleration sensitivity vectors are known, matching resonators can be selected and mounted in an anti-parallel arrangement in an attempt to try and cancel out the respective acceleration sensitivity vectors of the resonators. Such techniques suffer from the impracticalities of having to measure, select and precisely mount the resonators.

The third category of compensation techniques involves so-called active devices, where one or more accelerometers are used to sense the applied acceleration. The applied acceleration signal can then be used to control a frequency modulation circuit to cancel out the frequency changes induced in a resonator from the applied acceleration. This approach suffers from complications concerned with matching the response of the accelerometer to the resonator over a wide range of vibration frequencies, obtaining accurate accelerometer alignment, and also applying the correction signal to the oscillator frequency in a linear manner.

To overcome the impracticalities encountered with the above compensation techniques, multi-oscillator arrangements have been proposed, for example the arrangement described in U.S. Pat. No. 5,250,871, where four or more resonators are electrically connected in series, with their acceleration sensitivities aligned such that at there are at least two pairs of opposing vectors in each plane. Effectively the "law of large numbers" is used to overcome unit-to-unit variations, so that the more units, the more likely it is that their acceleration sensitivity vectors will cancel each other out. Such techniques are inherently costly, both financially due to the number of units, and in terms of space required for the multi-oscillator arrangements.

FIG. 1 shows side 2 and plan 4 views of a known resonator and package. The oscillator contains a strip resonator 12 mounted to a substrate 16 by a pair of mountings 20. The mountings 20 provide mechanical support and allow for electrical coupling of the resonator. The electrical connections may be in the form of excitation electrodes located above 18a, and below 18b, the resonator to sustain its oscillations. The resonator 12 may for example include a piezoelectric material such as quartz crystal. The resonator 12 is enclosed within a housing 22 for providing mechanical and environmental protection for the resonator. The form, material and method of adhering the housing components to each other and to the substrate is well known in the art, and includes hermetic packaging which may consist of sealing via a Kovar seal ring and seam welded lid. The substrate may for example be made of a ceramic material.

Each resonator has an active resonance region, which is the area defined by electrodes 18a and 18b. It is desirable that this area should be free from any mechanical restriction in order to allow the resonator to function correctly. As such it is desirable to isolate the resonators from as much mechanical stress as possible. To help achieve this, the resonator can be mounted in a cantilever fashion, with the active resonance region remote from the mounting region. These structures are robust, provide good decoupling of mounting strain, and are relatively straightforward to assemble. The cantilevers may be mounted using elements that naturally aid the relaxation of the stress between the package and the resonator, for example using compliant conductive adhesive. A limitation with such resonators is that the magnitude of the acceleration sensitivity vector along the length of the resonator can be relatively high. So, whilst cantilever-mounted resonators may be suited to situations in which compactness and flatness requirements are paramount, and in which relatively high alterations of resonant frequency due to acceleration can be tolerated, a cantilever-mounted resonator is far from ideal in applications requiring low sensitivity to acceleration.

FIG. 1A shows a perspective view of a strip resonator 200 with mountings 206. An active resonance region is defined by electrodes 202 located on either side of the resonator (connections not shown). The orthogonal x, y and z axes of the resonator are shown by coordinate system 204.

FIG. 1B shows a side view of resonator 200 with upper and lower electrodes 202 and mountings 206. When the resonator is subjected to acceleration in the z direction, i.e. along the z axis 208, stress is applied to the resonator through the mountings 206. The stress applied to the resonator varies across the profile of the resonator in the z direction, leading to a so-called non-uniform stress distribution, which is most acute in the region around the mountings 206. The non-uniformity of the applied stress due to acceleration decreases approximately exponentially with distance along the length of the cantilever away from the mountings (in the y direction). This means that the non-uniformity of the applied stress in the z direction decreases approximately exponentially with distance from the mountings to the free end of the resonator, i.e. with distance along the y axis, shown by graph 214. Therefore at a position 210 relatively close to the mountings, the stress applied to the resonator will be relatively non-uniform in the z direction, as indicated by arrows of differing lengths. At a position 212 relatively far from the mountings, the stress applied to the resonator will be relatively uniform in the z direction, as indicated by arrows having the same length. This effect is particularly pronounced in relation to small dimensions of resonator, which in this case is the z dimension (this being very small compared to the y and x dimensions of the resonator).

A similar effect occurs when the resonator is subjected to acceleration in the x direction. FIG. 1C shows a plan view of resonator 200, electrodes 202 and mountings 206. When the resonator is subjected to acceleration in the x direction, i.e. along the x axis 220, stress is applied to the resonator through the mountings 206. The non-uniformity of the applied stress in the x direction decreases approximately exponentially with distance from the mountings, i.e. with distance along the y axis, shown by graph 226. Therefore at a position 222 relatively close to the mountings, the stress applied to the resonator will be relatively non-uniform in the x direction, as shown by arrows of differing lengths. At a position 224 relatively far from the mountings, the stress applied to the resonator will be relatively uniform in the x direction, as indicated by arrows having the same length.

The stress applied uniformly along the edge of the resonator active area in the x and z directions leads to equal and balanced areas of tension and compression. These tend to cancel out any induced resonant frequency change and so lead to a low acceleration sensitivity.

The situation is different when the resonator is subjected to acceleration in the y direction as the y direction is aligned with the direction between the mountings and the resonator active area instead of being orthogonal thereto, as in the case for the x and z directions. FIG. 1D shows a plan view of resonator 200 with electrodes 202 and mountings 206. When accelerated in the y direction by a force applied from the end of the resonator where the mountings 206 are located, the non-uniformity of the applied stress in the y direction does not decrease exponentially with distance from the mountings along the y direction. In this case, the whole of the resonator is in compression, the compressive strain ranging from a maximum at the mountings to a minimum at the free end of the resonator. Similarly, when accelerated in the y direction by a force applied from the free end of the resonator, the whole of the resonator is in tension, the tension strain ranging from a maximum at the mountings to a minimum at the free end of the resonator. As a result there is a non-uniform and unbalanced stress distribution in the y direction across the active resonance region, as indicated by arrows 230 of differing lengths, and either the whole of the active region is in compression, or the whole of the active region is in tension.

In either of these cases, the applied stress changes from being non-uniform in the x and z directions at a position 240 relatively close to the mountings to being relatively uniform in the x and z directions at a position 242 relatively far from the mountings, where the active resonator region is located. In the y direction though, the applied stress is not uniform across the active resonance region of the resonator. In fact, the applied stress changes approximately linearly with distance along the resonator due to the linear change in resonator mass remaining to be accelerated, as indicated by arrows 230 of differing lengths.

This imbalance between areas of tension and compression over the active resonator region leads to an induced resonant frequency shift and hence a relatively high acceleration sensitivity in this y direction.

It would thus be desirable to implement a low-cost solution that reduces the acceleration sensitivity of an oscillator without the need for measurement, selection and precise specific individual alignment of resonators.

SUMMARY OF THE INVENTION

In accordance with a first aspect of the present invention, there is provided an oscillator comprising a plurality of resonator portions, each said resonator portion having an active resonance region defined between a set of electrodes capable of receiving signals caused by oscillator resonance in said active resonance region during operation of said oscillator, each of said resonator portions being mounted asymmetrically in said oscillator using one or more mountings, the asymmetry of said mountings with respect to each active resonance region defining, for each active resonance region, a dominant axis passing through the active resonance region and providing a relatively large acceleration sensitivity along said dominant axis and relatively small acceleration sensitivities along axes orthogonal to said dominant axis, said resonator portions being mounted in said oscillator such that the acceleration sensitivities, of the respective active resonance regions along their respective dominant axes, are directed in different directions so as to reduce the sensitivity of the oscillator to acceleration.

Embodiments of the present invention thus propose an oscillator with asymmetric mounting of a plurality of resonator portions each having an active resonance region. The asymmetric mounting of the resonator portions means that each resonator portion has an axis passing through its active resonance region along which the acceleration sensitivity vector is dominant, i.e. the sensitivity to acceleration along the direction defined by the dominant axis is much greater than the sensitivity to acceleration in other directions. As described in the background section, this is because, when an individual resonator is subjected to acceleration in the dominant y axis direction, there is no balancing of applied stress across the active resonance region in the y direction, as either the whole of the active resonance region is in compression or the whole of the active resonance region is in tension, whereas when the resonator is subjected to acceleration in either the x or z directions, an expansion in one part of the resonator is balanced by a contraction in another part of the resonator giving rise to a balanced strain distribution across the resonator in these directions.

As also described above in the background section, a dominant acceleration sensitivity vector has made such asymmetrical resonators undesirable in some applications. However, the present invention uses this to its advantage, and by mounting the resonators in a composite oscillator such that their dominant axes are directed in different directions, e.g. an anti-parallel arrangement, the dominant acceleration sensitivity vectors can cancel each other out. The components of the acceleration sensitivity along the non-dominant axes orthogonal to the dominant acceleration sensitivity vector are still present, but as their effect on the total acceleration sensitivity of the composite oscillator is much less, the result is a composite oscillator with reduced sensitivity to acceleration.

It will be appreciated from the foregoing that the acceleration sensitivity along the non-dominant axes can be reduced if balancing of strain occurs. For this to occur, the stress applied by the acceleration must be applied uniformly across the active resonance region of the resonator. Therefore, preferably, the active resonance region is located in a region where the applied stress is uniform in both the non dominant x and z axis directions.

Preferably there are two resonator portions and, as mentioned above, their dominant acceleration sensitivity vectors are directed in opposite directions, i.e. anti-parallel, such that they cancel each other out. Because of the asymmetrical mounting of the resonators, the dominant sensitivity axes of the resonators can be predicted without measurement or precise selection of the resonators, which can be costly and time consuming processes. Further, no individually specific alignment is needed to direct the dominant axes of the respective resonators during mounting of the resonators in the oscillator.

In one arrangement, the oscillator may include two or more separately mounted individual resonator portions, which may be mounted within a separate housing or within the same housing.

In an alternative arrangement, the resonator portions may be integrally formed and may be connected by a central portion via which the resonator portions are mounted. This arrangement has the added advantage that, since the resonator portions are part of an integral structure, the housing for the portions may be smaller; in addition, coordination of their respective orientations is not required in order to locate the two resonators in an anti-parallel manner, since by definition the orientations are automatically aligned.

Preferably, the resonator portions are mounted to a substrate by a cantilever mounting arrangement such that a first end of each resonator portion is mounted and a second end is free. The cantilever mounting arrangement may include a pair of mountings adjacent the first end of each resonator portion and provide mechanical coupling to the substrate and also electrical coupling to the electrodes.

Preferably, each active resonance region is located towards the second, free end of each resonator portion. As explained above, the amount of non-uniform stress in a resonator portion decreases with distance from the resonator portion mounting point(s). Thus locating the active resonance region away from the mountings means that the applied stress in the active resonance region along the non-dominant axes is more uniform than it would have been had the active resonance region been located in the vicinity of the mountings. When the active resonance region is positioned far from the mounting points, the acceleration sensitivity along the non-dominant axes is therefore reduced. Moreover, since the stress distribution in the dominant axis direction is not uniform in regions where the stress distribution in the non-dominant axes is uniform, locating the electrodes in these regions increases the asymmetry of the resonator portion mounting. This increased asymmetry results in a more dominant and well controlled acceleration sensitivity vector which in turn allows greater cancellation of acceleration sensitivity in the composite oscillator. In fact, the tolerance on the asymmetry can be well controlled to give a narrow distribution of the acceleration sensitivity in the dominant axis in terms of both magnitude and direction, which in turn leads to more effective cancellation of acceleration sensitivity.

Preferably, each resonator portion includes an elongate member, which, having sides of a relatively large dimension, means that the non-uniform strain distribution in the x and z directions decays to a sufficiently small magnitude so as to enable the active resonance region to be positioned in a region of uniform stress in relation to these two directions, thereby reducing the acceleration sensitivity in these directions. Similarly the elongate member allows the non-uniform and unbalanced strain distribution in the y direction to be more controlled and predictable over the active resonator region. This increased mounting asymmetry, resulting from configuring the resonator portion as an elongate member, leads to a yet more dominant and consistent acceleration sensitivity vector than is achievable with, say, resonator portions configured as circular members, which in turn allows yet greater cancellation of acceleration sensitivity.

More specifically, elongate cantilever mounted resonators, for example strip resonators, tend to have more predictable acceleration sensitivity vectors than those of traditional clip mounted circular resonators. This means that the magnitude of the dominant acceleration sensitivity vectors of individual strip resonators have a narrower distribution, and are therefore more likely to closely match in a composite oscillator, which in turn gives rise to increased acceleration sensitivity cancellation. This further avoids the need for measurement and selection of matching resonators for use in the composite oscillator.

Preferably, the dominant axes of the resonator portions are substantially aligned with the longitudinal axes of the elongate resonator portions, and the acceleration sensitivities of the respective active resonance regions along their dominant axes are directed in substantially opposite directions. This provides for a higher level of cancellation of acceleration sensitivity for a given pair of resonator portions.

The resonator portions may include a piezoelectric crystal or one or more Micro Electrical Mechanical System (MEMS) devices. The piezoelectric crystal may be a Bulk Acoustic Wave (BAW) device or a Surface Acoustic Wave (SAW) device.

In one arrangement, the plurality of resonator portions are electrically coupled in parallel. An advantage of using a parallel connection rather than a series connection is that with a parallel connection, it is easier to alter (i.e. pull) the resonant frequency of the oscillator over a larger range (an increase by a factor of approximately two for the parallel case compared with a decrease by a factor of approximately two for the series case as compared to the individual resonator). This is an important parameter as it is desirable to be able to alter the resonant frequency of the oscillator for tuning purposes.

The requirements for two crystals in parallel or series to act as one crystal in the oscillator requires that their resonant frequencies and equivalent circuit parameters are close, especially for higher Q resonators. This is especially true for parallel connection if the oscillator is operating near series resonance; however if the oscillator is operating away from series resonance then the requirements are far less demanding. For example for a 10 MHz oscillator operating at 10 pF, i.e. the oscillator sustaining circuit has an input impedance of 10 pF, and typical resonator values of motional capacitance 7 fF and Q of 100,000 then a deviation of 100 ppm can be easily tolerated between the resonators. This would still allow the frequency of the composite oscillator to be pulled +/−100 ppm without encountering problems, which is significantly higher than that normally required for temperature compensation and nominal frequency adjustment, even allowing for ageing. Therefore operating at load allows standard tolerance crystals to be used without additional measurement and selection over and above that required for single resonator oscillators.

In accordance with a second aspect of the present invention, there is provided a method of manufacturing an oscillator with reduced sensitivity to acceleration, the method comprising the steps of providing a plurality of resonator portions, for each said resonator portion, defining an active resonance region between a set of electrodes so as to be capable of receiving signals at said electrodes caused by oscillator resonance in said active resonance region during operation of said oscillator, mounting each of said resonator portions asymmetrically in said oscillator using one or more mountings, the asymmetry of said mountings with respect to each active resonance region defining, for each active resonance region, a dominant axis passing through the active resonance region and providing a relatively large acceleration sensitivity along said dominant axis and relatively small acceleration sensitivities along axes orthogonal to said dominant axis, and mounting said resonator portions in said oscillator such that the acceleration sensitivities, of the respective active resonance regions along their respective dominant axes, are directed in different directions so as to reduce the sensitivity of the oscillator to acceleration.

Further features and advantages of the invention will become apparent from the following description of preferred embodiments of the invention, given by way of example only, which is made with reference to the accompanying drawings.

DETAILED DESCRIPTION OF THE INVENTION

The present invention sets out to provide an oscillator having reduced sensitivity to acceleration, i.e. an oscillator which exhibits reduced variation in output resonant frequency when subjected to accelerating forces.

Figure 1:
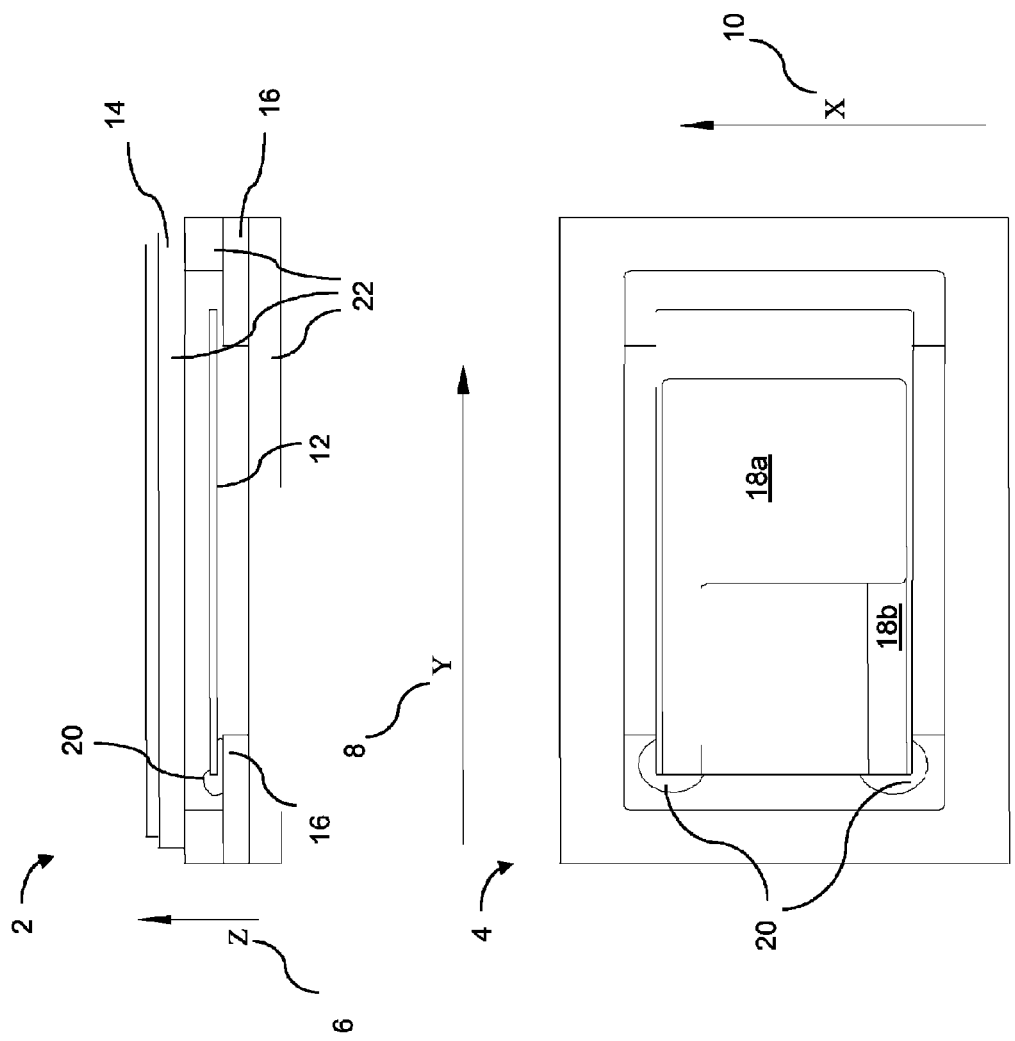
FIG. 1 shows side and plan views of a known resonator and package.
Figure 1A:
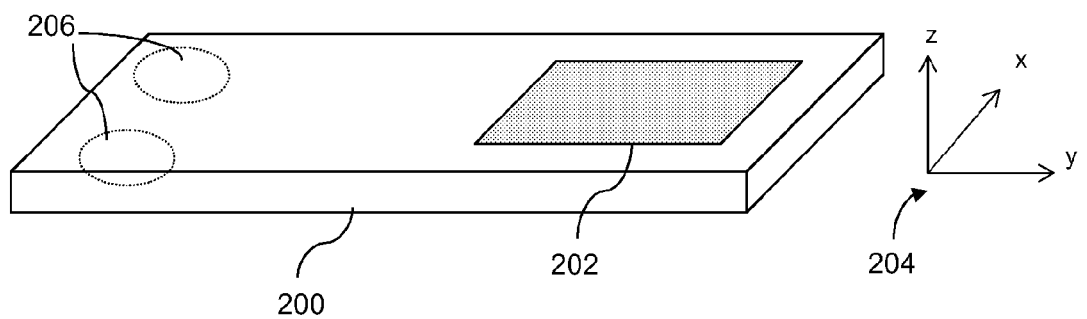
FIG. 1A shows a perspective view of a resonator according to FIG. 1.
Figure 1B:
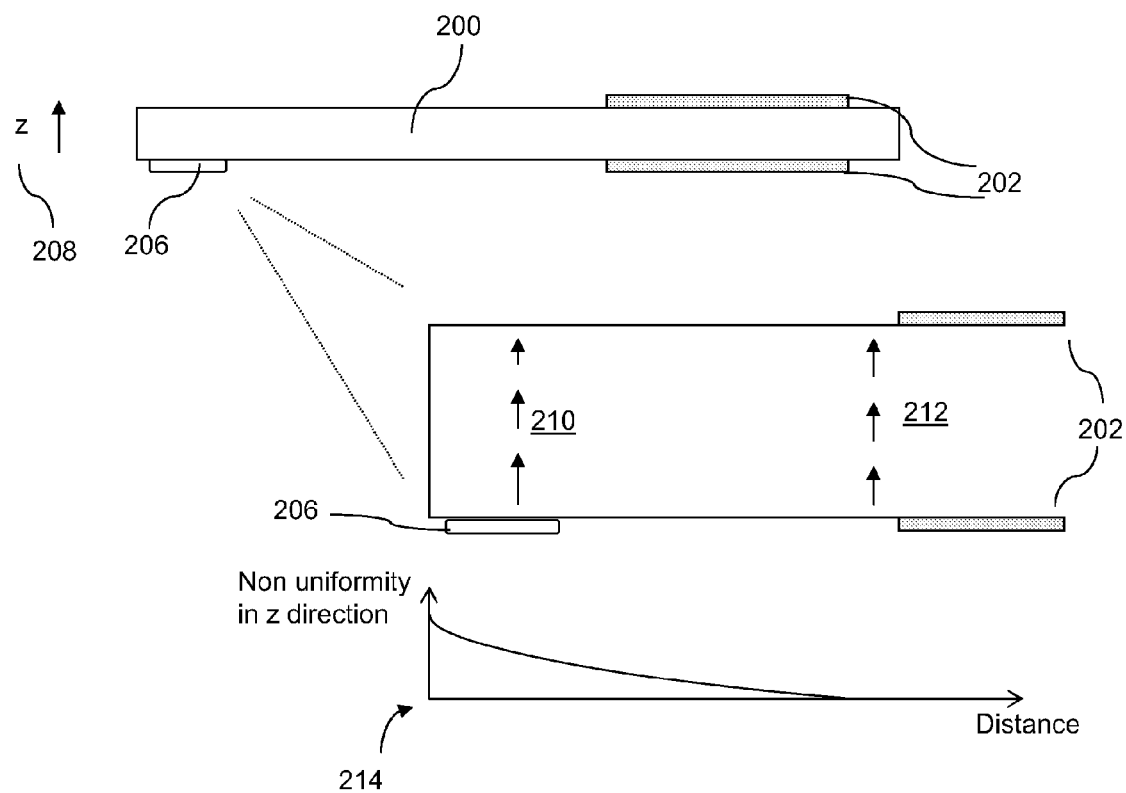
FIG. 1B shows a side view of a resonator according to FIG. 1A, subjected to acceleration along its z axis.
Figure 1C:
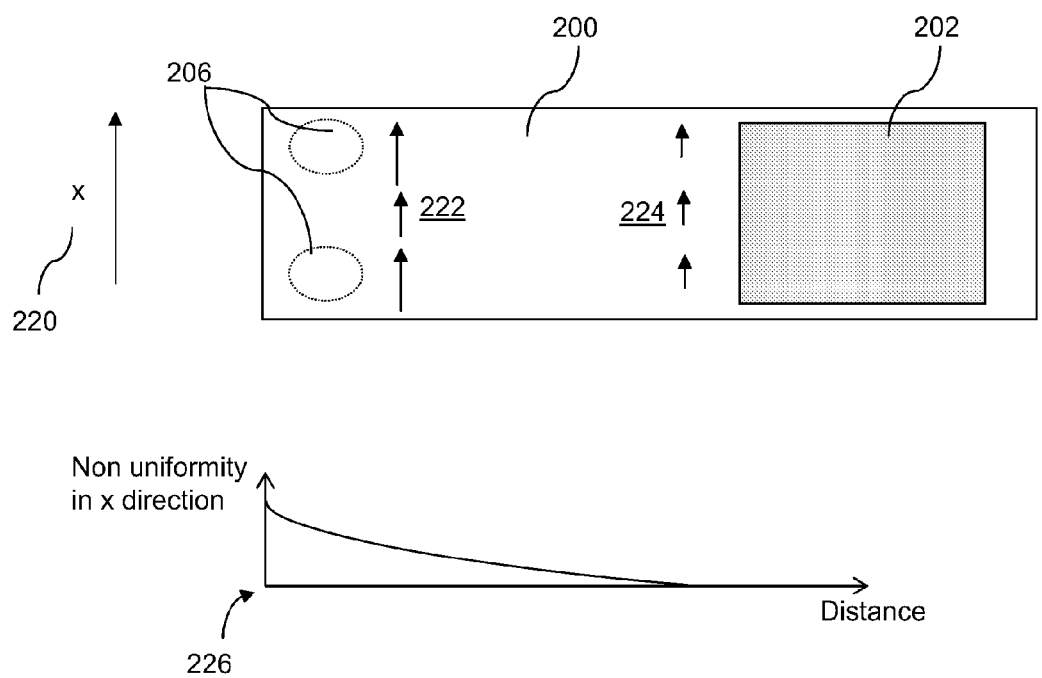
FIG. 1C shows a plan view of a resonator according to FIG. 1A, subjected to acceleration along its x axis.
Figure 1D:
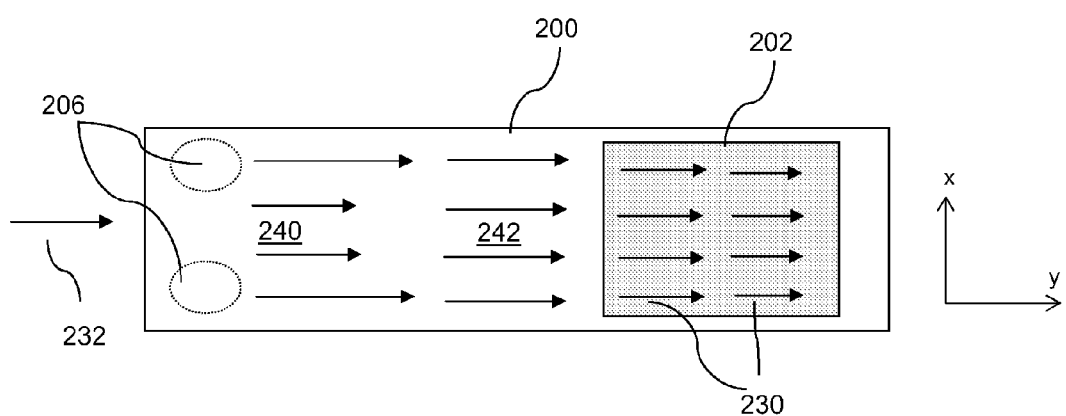
FIG. 1D shows a plan view of a resonator according to FIG. 1A, subjected to acceleration along its y axis.

As described in the background section above, a known resonator and package 12 as shown in FIG. 1 containing an asymmetrically mounted resonator 12, exhibits a relatively large and predictable sensitivity to acceleration along its Y axis 8 and relatively small sensitivities to acceleration along the X axis 10 and Z axis 6 which are orthogonal to the Y axis 8. The Y axis 8 acceleration sensitivity vector dominates the X and Z acceleration sensitivity vectors such that the overall or total acceleration sensitivity of the oscillator is largely due to the dominant Y axis acceleration sensitivity.

Figure 2:
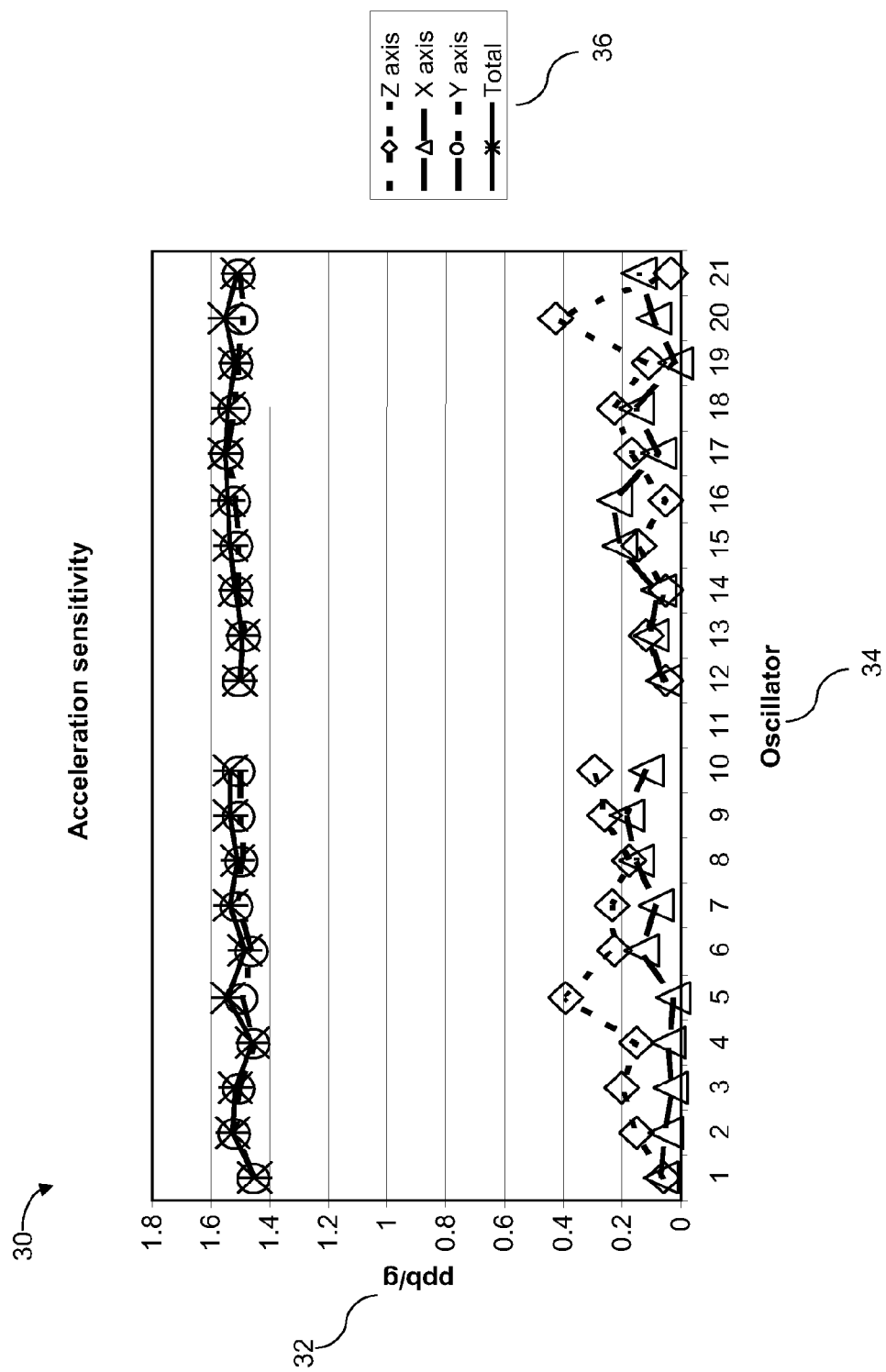
FIG. 2 is graph showing the acceleration sensitivity vectors of a number of resonators according to FIG. 1.

FIG. 2 is a graph 30 showing the acceleration sensitivity vectors of a number of oscillators according to embodiments of the present invention. The figure shows typical example results for the measured acceleration sensitivity for twenty oscillators, each comprising a strip resonator randomly sampled from a production batch, as shown by the left-to-right scale 34. Here the individual acceleration sensitivity vectors along the X, Y and Z axes have been measured and plotted for each sample oscillator 34. The individual acceleration sensitivity vectors can be distinguished in the graph by the use of triangles, circles and diamonds respectively, as shown legend 36. The top-to-bottom scale 32 is given in parts per billion ($10^{-9}$) per g (ppb/g), where g is the acceleration due to gravity, i.e. approximately 9.81 ms$^{-2}$. The ppb/g unit is commonly used for acceleration sensitivity comparisons.

Additionally, the total acceleration sensitivity magnitude $|\Gamma_{total}|$, is included in FIG. 2. This is calculated as the square root of the sum of the squares of the individual acceleration sensitivity vectors $\Gamma_x$, $\Gamma_y$, and $\Gamma_z$, along the X, Y and Z axes respectively, according to the following equation:

$$|\Gamma_{total}| = \sqrt{\Gamma_x^2 + \Gamma_y^2 + \Gamma_z^2}$$

FIG. 2 demonstrates that the total acceleration sensitivity magnitude $|\Gamma_{total}|$, (plotted with crosses according to legend 36), is dominated by the individual acceleration sensitivity vector along the Y axis $\Gamma_y$, as the plots for $|\Gamma_{total}|$ and $\Gamma_y$ match very closely for all twenty of the sampled oscillators.

Figure 3:
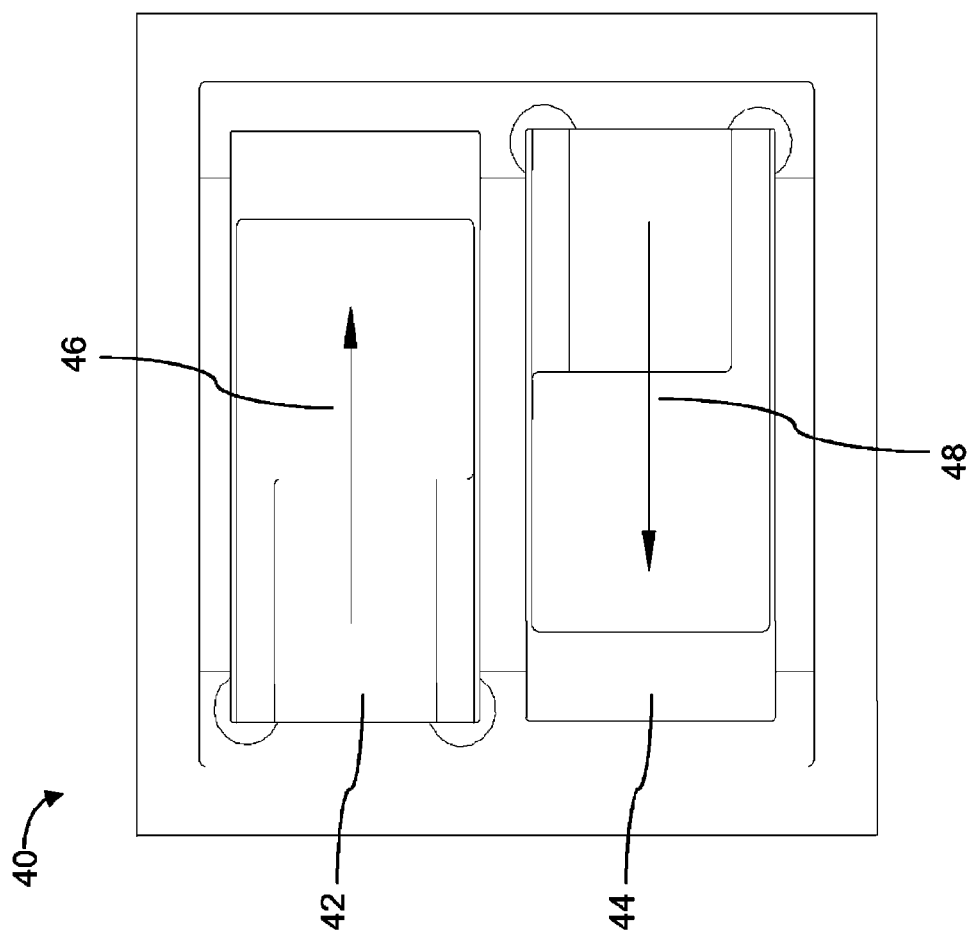
FIG. 3 is a plan view of a pair of resonators mounted in a substrate such that their dominant acceleration sensitivity vectors are directed in substantially opposite directions according to an embodiment of the present invention.

FIG. 3 is a plan view 40 of a package including a pair of resonators 42, 44 (for example each resonator being similar to that shown in FIG. 1) mounted in a substrate such that their dominant acceleration sensitivity vectors, 46 and 48 respectively, are directed in substantially opposite directions, i.e. substantially anti-parallel, according to an embodiment of the present invention. The composite oscillator effectively functions as an average of the two resonators, so a perturbation due to the acceleration sensitivity of one resonator can be cancelled by the other if the magnitudes are similar and opposite in direction.

Figure 4:
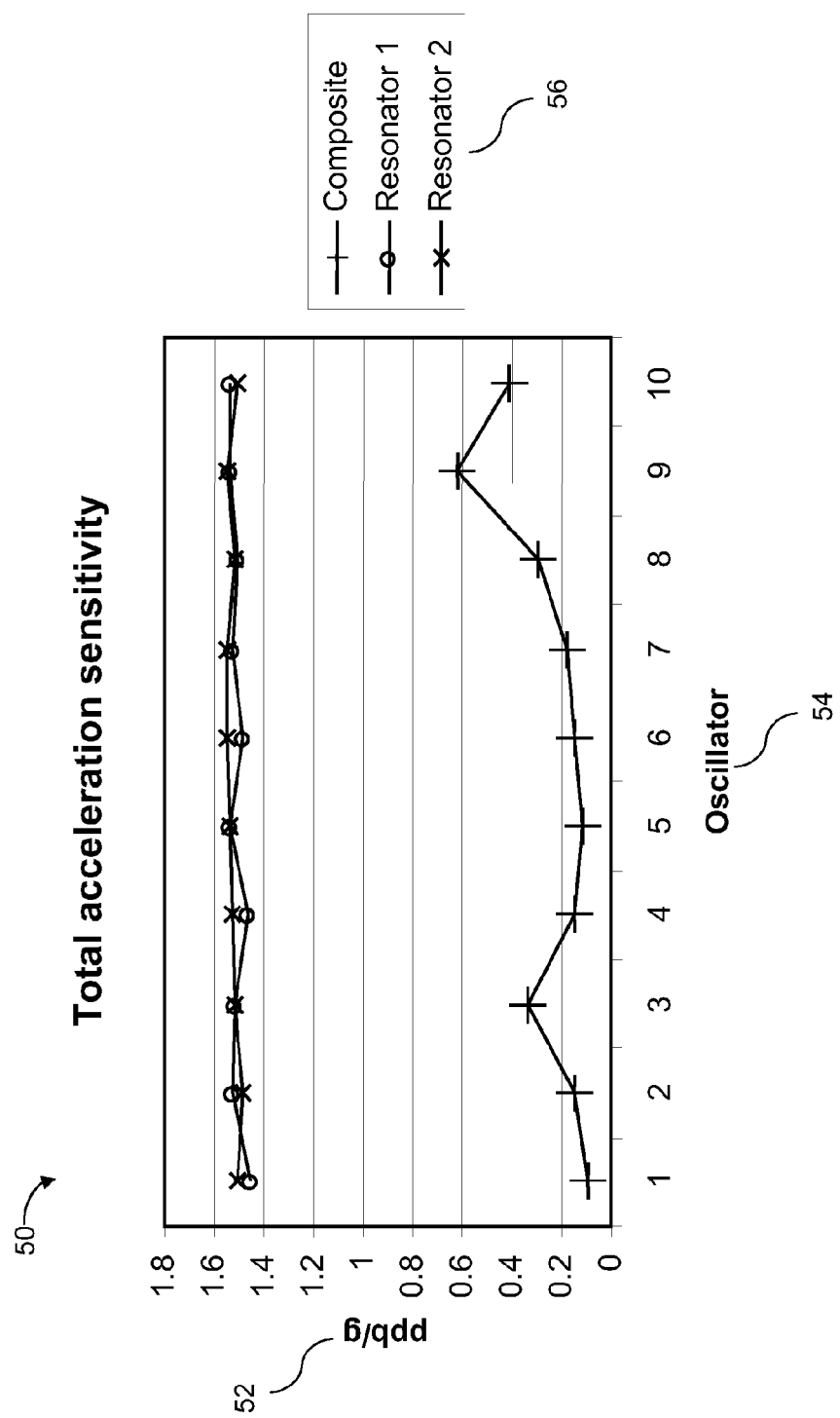
FIG. 4 is graph showing the total acceleration sensitivity of a number of individual and paired resonators according to embodiments of the present invention.
Figure 6:
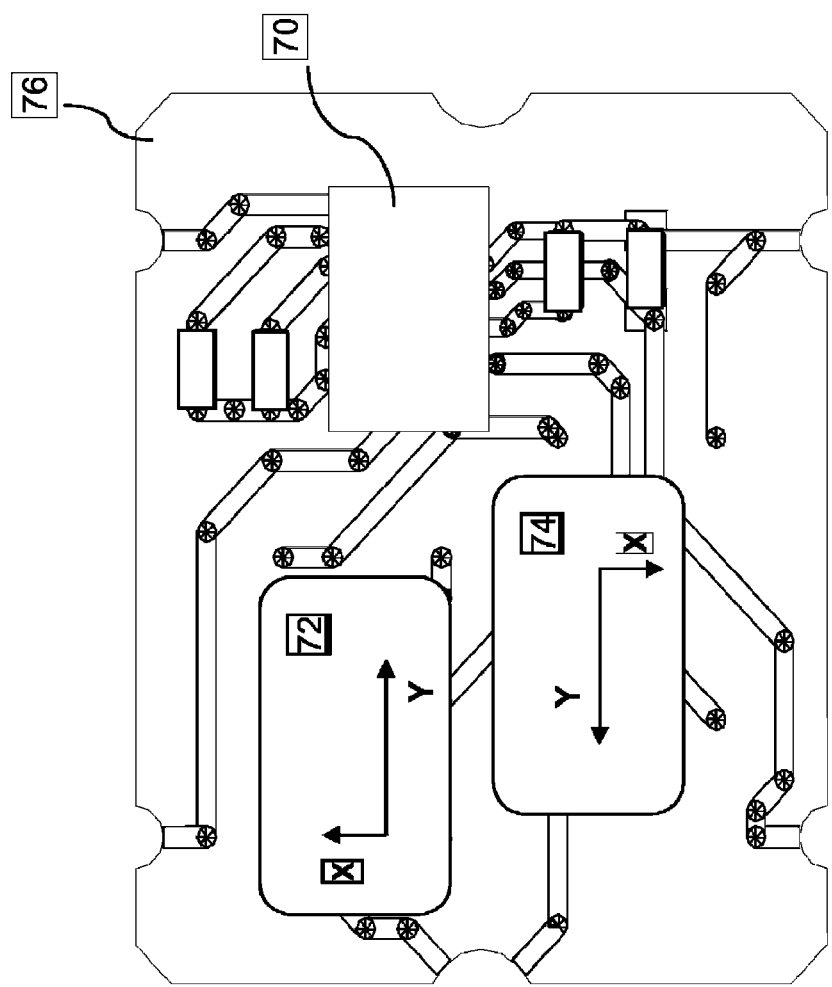
FIG. 6 is a schematic of an oscillator with a circuit board where an application specific integrated circuit and a pair of resonators are mounted according to an embodiment of the present invention.

FIG. 4 is graph 50 showing the total acceleration sensitivity of a number of individual and composite oscillators according to embodiments of the present invention. The composite oscillators include a pair of packaged resonators arranged substantially parallel as shown in FIG. 6.

Here the total acceleration sensitivity for each individual resonator is shown by circles and crosses, as shown by legend 56, with the top-to-bottom scale 52 being the same as for FIG. 2 and the left-to-right device scale indicating each oscillator. The total combined acceleration sensitivity for each composite oscillator pair is also plotted with pluses, as shown by legend 56.

FIG. 4 shows that for each oscillator, the total acceleration sensitivity is approximately the same for resonator 1 as it is for resonator 2. As the total acceleration sensitivity for each resonator is dominated by the acceleration sensitivity along the Y axis (as shown in FIG. 2), when the individual resonators 1, 2 are combined to form a composite oscillator and the Y axes are directed in substantially opposite directions, these dominant components of the total acceleration sensitivity approximately cancel each other out for each composite oscillator. This means that the components remaining in the total acceleration sensitivity for each composite oscillator are approximately those along the X and Z axes. As will be appreciated from FIG. 2, these are of much lower magnitude than the Y axis components, and the total acceleration of the composite oscillator can be seen to be reduced by a factor between 2.5 and 10.

The above discussion describes the present invention in relation to strip resonators, which have a cantilever mounted elongate form. A strip resonator is a cut down rectangular version of the more traditional circular resonator, which is mounted using two or more clips arranged on opposing edges. Because the active area of strip is in close proximity to the edges, the dimensions of the active area and the resonator need to be precisely designed and controlled to avoid coupling to unwanted resonance modes. This requirement, together with the simplicity of the package and cantilever mounting, has lead to highly automated and precise manufacturing methods. The level of manufacturing control has the added advantage of controlling the acceleration sensitivity and making it more predictable. Conversely the acceleration sensitivity vectors of a standard clip mounted circular resonator cannot be easily predicted and must be measured for each individual resonator.

An anti-parallel arrangement of clip mounted circular resonators requires accurate identification of the acceleration sensitivity vectors and precise alignment of the resonators in anti-parallel in order to reduce the overall effects of sensitivity to acceleration by cancellation. This is not a process which lends itself to high volume, low cost applications and is therefore considered undesirable. When using a cantilever mounted elongated resonator, i.e. a strip resonator, it is easier to achieve alignment because their natural anisotropy helps to remove the need for the measurement and selection stages.

Figure 5:
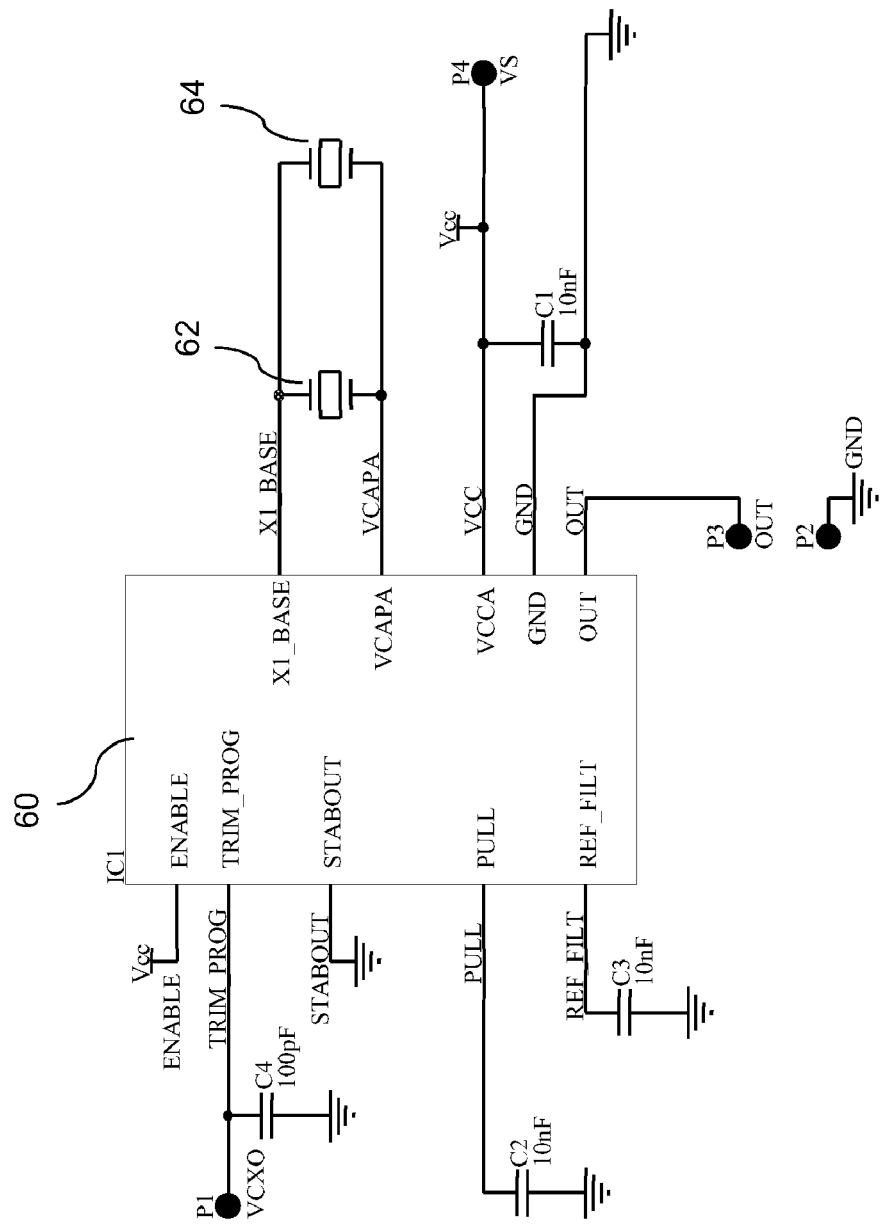
FIG. 5 is a circuit schematic of a temperature controlled crystal oscillator with a pair of piezoelectric resonators connected in parallel according to an embodiment of the present invention.

FIG. 5 is a circuit schematic of a temperature controlled crystal oscillator with a pair of piezoelectric crystal resonators 62, 64 connected in parallel according to an embodiment of the present invention. Component 60 is a commercially available Application Specific Integrated Circuit (ASIC) capable of performing temperature compensation for the resonators 62, 64, whose performance may vary with temperature. The standard circuit components, component values and signal names are given purely for exemplary purposes and should not be taken to limit application of the present invention in any form.

Here the resonators 62, 64 are shown to be connected in parallel. As mentioned above the resonators are preferably electrically connected in a parallel configuration and run at load resonance thereby removing the need to precisely frequency match the pair of resonators. Despite this, it is not necessary for the resonators to be connected in parallel to act as a composite oscillator and they may also be electrically connected in series.

To achieve a high level of acceleration sensitivity cancellation, it is desirable for two resonators to be placed as near to each other in the oscillator as is practicably possible or convenient. This will reduce the possibility of the two resonators experiencing different accelerating forces that may arise in different areas of a housing due for example to any mechanical flexibility or rotation about an axis near the oscillator or such like. FIG. 3 shows one way this could be achieved where the resonators are mounted in a cantilever fashion as described above on a single substrate, which in turn is mounted in a single housing. Where the performance of the oscillator does not require such a high degree of reduction in acceleration sensitivity, or where the design of the housing satisfactorily eliminates any inhomogeneous acceleration forces therein, then the resonators may be mounted on separate substrates or indeed in individual housings altogether.

FIG. 6 is a schematic of an oscillator with a circuit board 76, upon which are mounted an application specific integrated circuit 70 embedded in a housing and a pair of resonators 72, 74 according to an embodiment of the present invention. The resonators 72, 74 can be seen to be mounted in an anti-parallel arrangement such that their dominant Y axis acceleration sensitivity vectors are directed in substantially opposite directions. The ASIC could be attached for example by flip-chip or wire-bond attachment methods.

Figure 7:
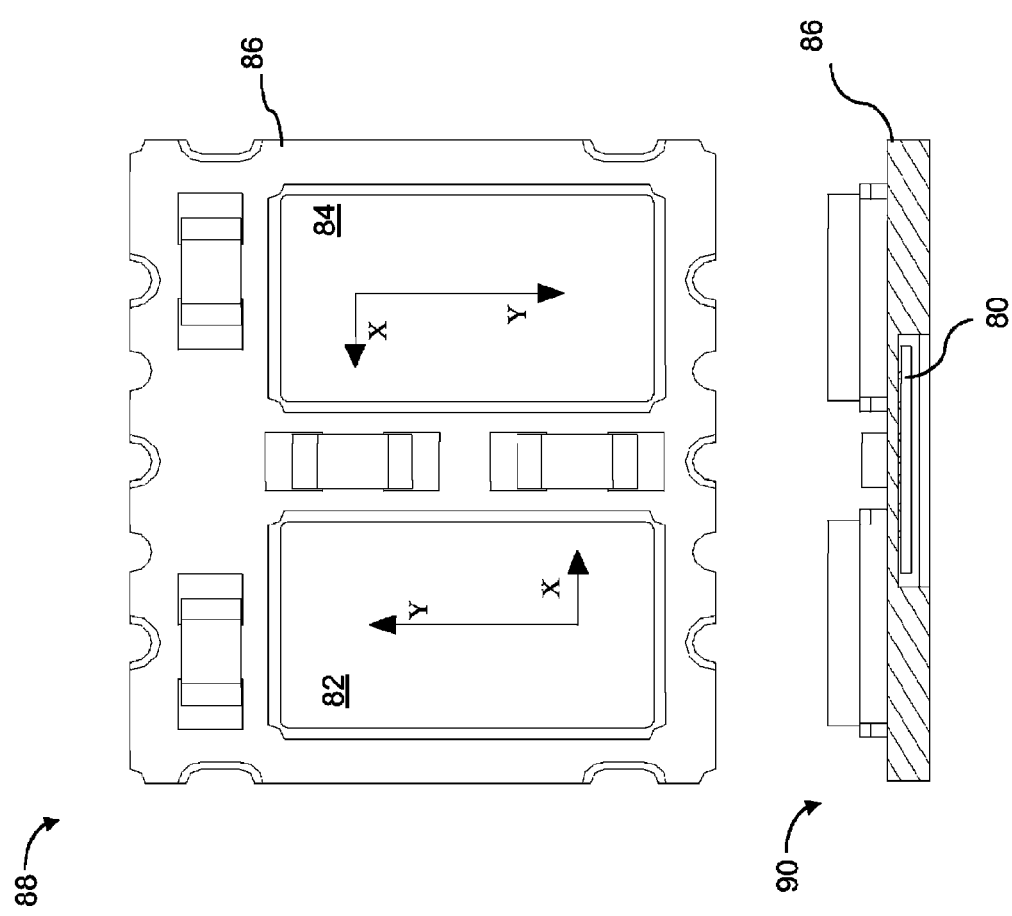
FIG. 7 shows side and plan views of an oscillator with a circuit board and two individual resonators mounted in separate housings according to an embodiment of the present invention.

FIG. 7 shows side 90 and plan 88 views of an oscillator with circuit board 86 and two individual resonators 82, 84 mounted in separate housings according to an embodiment of the present invention. In this embodiment an ASIC 80 is embedded below the two resonators. An alternative to this arrangement would be to use one housing unit for both resonators.

Figure 8:
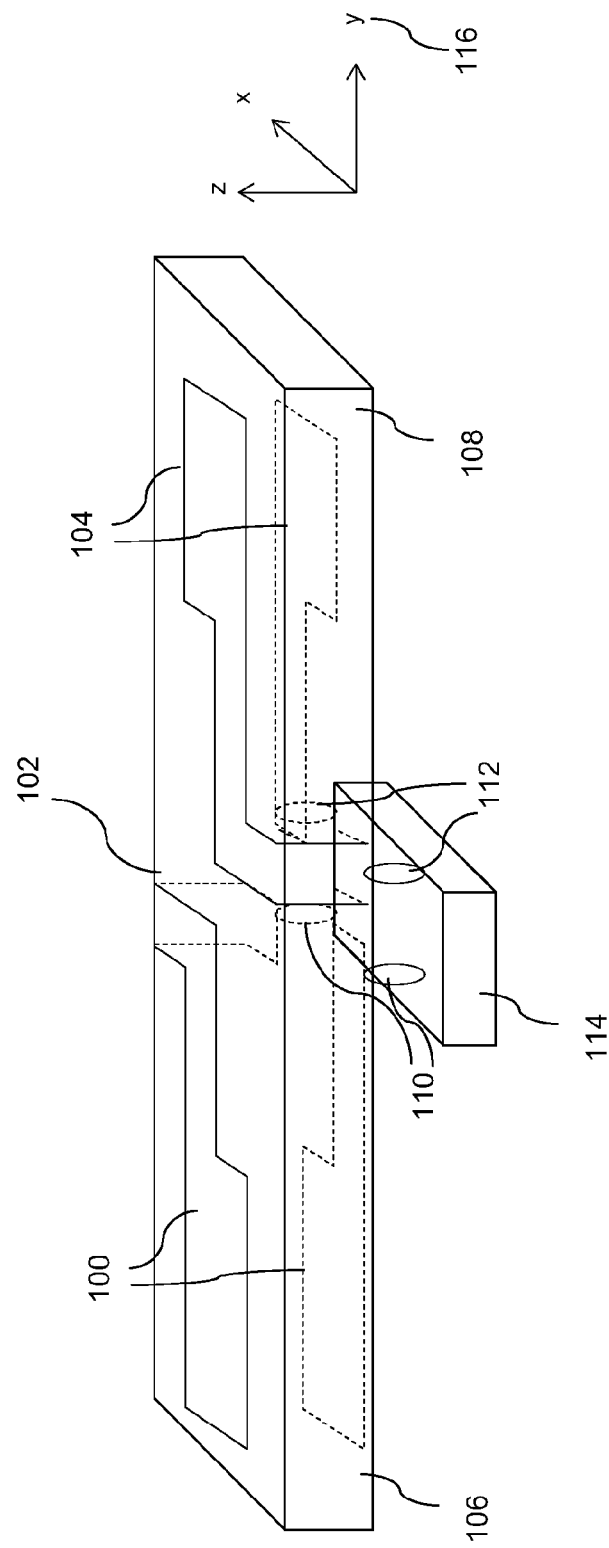
FIG. 8 is a perspective view of a composite resonator according to a second embodiment of the present invention.

FIG. 8 is a perspective view of an oscillator according to a second embodiment of the present invention. In this embodiment, two resonator portions 106, 108 are integrally formed. The two resonator portions may be connected via a central portion 102, giving a "see-saw" type arrangement. Each resonator portion 106, 108 has respective mountings 110, 112 located in the central portion for mounting the integrally formed resonator portions 106, 108 to a substrate 114. Each resonator portion 106, 108 has a set of electrodes, 100, 104 respectively, located above and below each resonator portion which define an active resonance region in each resonator portion and allow excitation for sustaining oscillations of the resonators.

In an alternative arrangement, resonator portions 106, 108 could share a single mounting (not shown). A single mounting for each resonator portion may serve to reduce mounting stress applied to each of the resonator portions, due to the reduced number of points of contact through which mounting stress could be transmitted. The mounting stresses applied to each resonator portion may also be more evenly matched with a single mounting, which could help to provide more closely matching, and hence more evenly cancelling acceleration sensitivities for each resonator portion. Further, a single mounting may be simpler and cheaper to manufacture.

The embodiment depicted in FIG. 8 operates on a similar principle to other embodiments of the present invention described above, i.e. due to the asymmetric nature of the mounting(s), each resonator portion has a dominant acceleration sensitivity vector passing through its active resonance region along the y axis 116; however, due to the central mounting arrangement, these dominant acceleration sensitivity vectors are inherently directed in opposing directions. This leads to cancellation of the dominant components, i.e. the components directed along the y axis 116, in the total acceleration sensitivity for the oscillator in a similar manner to the embodiments described above.

In view of the fact that the strain effect of the mountings decays (approximately exponentially) along the resonator in a direction away from the mountings, exact symmetry of a given resonator portion about the mounting is not required. Indeed, all that is required is for the resonator pairs to share the same centre of symmetry. It will be appreciated that whilst the mounting of the resonator portions into the resonator package remains relatively non-critical, use of more precise mounting arrangements can nevertheless lead to a reduction in the length of resonator required to achieve a certain performance specification.

The above embodiments are to be understood as illustrative examples of the invention. It is to be understood that any feature described in relation to any one embodiment may be used alone, or in combination with other features described, and may also be used in combination with one or more features of any other of the embodiments, or any combination of any other of the embodiments.

The preferred resonator type for this invention is a BAW (bulk acoustic wave) type device, however it is also considered that the same invention may be implemented with another type of resonator, for example a SAW (surface acoustic wave) type device.

The above description has focused mainly on piezoelectric type resonators, but the principles of the present invention could also be applied to Micro Electrical Mechanical System (MEMS) devices. Each resonator could be replaced by a MEMS resonator, the operation of which is known in the art.

The present invention could be applied to oscillators with more than two resonator portions. For example, three resonator portions could be employed and their dominant acceleration sensitivity vectors aligned at approximately 120°.

The above description mentions a cantilever arrangement with two mounting points for mounting resonators in the oscillator, but the present invention should not be thus limited. Any type of mounting arrangement with any number of mounting points could be used, the minimum requirement being that some asymmetry is provided which gives rise to a predictable dominant acceleration sensitivity vector for each resonator. Further any shape of resonator may be employed and need not be rectangular.

An oscillator according to the present invention could be applied in a wide variety of devices where a high purity, stable frequency reference is required under environments experiencing acceleration or vibration. Such devices could be used in mobile and aerospace applications, but also devices experiencing vibration from, for example cooling fans in fixed installations. Example applications could be telephony, Global Positioning System (GPS), radio communications and wireless networking. Such oscillators could be used in many different applications, for example in military hardware (including land, sea and air) and in the automotive industry.

The resonator may include a Micro Electrical Mechanical System (MEMS) device.

The principles by which the oscillator of the present invention functions could also be employed in accelerometer devices and arrangements.

Furthermore, equivalents and modifications not described above may also be employed without departing from the scope of the invention, which is defined in the accompanying claims.

The invention claimed is:

1. An oscillator comprising:
    a plurality of resonator portions, each said resonator portion having an active resonance region defined between a set of electrodes capable of receiving, by electrical coupling, signals caused by oscillator resonance in said active resonance region during operation of said oscillator,
    each of said resonator portions being a cantilever-mounted resonator portion that is mounted in said oscillator using one or more mountings, each resonator portion comprising first and second ends, the first end of each resonator portion being mounted to a substrate via at least one of said mountings, the second end of each resonator portion being free, each active resonance region having a relatively large acceleration sensitivity along a dominant axis and relatively small acceleration sensitivities along axes orthogonal to said dominant axis,
    said resonator portions being cantilever-mounted in said oscillator to direct the acceleration sensitivities, of the respective active resonance regions along their respective dominant axes, in substantially opposite directions so as to reduce the sensitivity of the oscillator to acceleration.

2. An oscillator according to claim 1, wherein said oscillator comprises two or more individual resonator portions separately mounted therein.

3. An oscillator according to claim 2, wherein two or more of said individual resonator portions are mounted within separate housings.

4. An oscillator according to claim 2, wherein two or more of said individual resonator portions are mounted within the same housing.

5. An oscillator according to claim 1, wherein said oscillator comprises two integrally formed resonator portions.

6. An oscillator according to claim 5, wherein said resonator portions are connected via a central portion and said mountings for each resonator portion are located in said central portion.

7. An oscillator according to claim 1, wherein said cantilever mounting arrangement comprises a pair of mountings adjacent the first end of each resonator portion, the connections providing both mechanical coupling to the substrate and electrical coupling to said set of electrodes.

8. An oscillator according to claim 1, wherein each active resonance region is located towards the second end of its respective resonator portion.

9. An oscillator according to claim 1, wherein each said resonator portion comprises an elongate member having sides of a relatively large dimension and first and second ends having a relatively small dimension and a longitudinal axis extending between said first and second ends.

10. An oscillator according to claim 9, wherein said dominant axes are substantially aligned with the longitudinal axes of said elongate resonator portions.

11. An oscillator according to claim 1, wherein the longitudinal axes are directed in substantially opposite directions.

12. An oscillator according to claim 1, wherein said resonator portions comprise a piezoelectric crystal.

13. An oscillator according to claim 12, wherein one or more of said resonator portions comprises a Bulk Acoustic Wave (BAW) device.

14. An oscillator according to claim 12, wherein one or more of said resonator portions comprises a Surface Acoustic Wave (SAW) device.

15. An oscillator according to claim 12, wherein one or more resonator portion comprises one or more of:

quartz (SiO2),
lithium tantalate (LiTaO3),
lithium niobate (LiNbO3).

16. An oscillator according to claim 1, wherein said resonator portion comprises one or more Micro Electrical Mechanical System (MEMS) devices.

17. An oscillator according to claim 1, wherein said plurality of resonator portions are electrically coupled in series.

18. An oscillator according to claim 1, wherein said plurality of resonator portions are electrically coupled in parallel.

19. An oscillator circuit comprising an oscillator according to claim 1 and an integrated circuit electrically coupled to each of the resonator portions for providing a frequency output that exhibits substantially reduced sensitivity to acceleration.

20. A mobile telephone comprising an oscillator according to claim 1.

21. A mobile global positioning system (GPS) device comprising an oscillator according to claim 1.

22. A method of manufacturing an oscillator with reduced sensitivity to acceleration, the method comprising the steps of:
providing a plurality of resonator portions;
for each said resonator portion, defining an active resonance region between a set of electrodes so as to be capable of receiving, by electrical coupling, signals caused by oscillator resonance in said active resonance region during operation of said oscillator;
mounting each of said resonator portions in said oscillator as a cantilever-mounted resonator portion using one or more mountings, each resonator portion comprising first and second ends, the first end of each resonator portion being mounted to a substrate via at least one of said mountings, the second end of each resonator portion being free, each active resonance region having a relatively large acceleration sensitivity along a dominant axis and relatively small acceleration sensitivities along axes orthogonal to said dominant axis; and
cantilever-mounting said resonator portions in said oscillator to direct the acceleration sensitivities, of the respective active resonance regions along their respective dominant axes, substantially opposite directions so as to reduce the sensitivity of the oscillator to acceleration.

* * * * *